United States Patent [19]

Mayer et al.

[11] 3,750,031

[45] July 31, 1973

[54] TUNING DEVICE FOR RADIO-FREQUENCY COMMUNICATIONS EQUIPMENT

[75] Inventors: Rudolf Mayer, Rottweil; Hans Sakautzki, Stetten ob Rottweil; Lothar Volkheimer, Trossingen, all of Germany

[73] Assignee: Hopt Electronic GmbH, Germany

[22] Filed: July 6, 1971

[21] Appl. No.: 159,780

[30] Foreign Application Priority Data

July 10, 1970 Germany .................. P 20 34 250.1

[52] U.S. Cl. ................ 325/452, 74/10.29, 325/464, 338/131, 334/14

[51] Int. Cl. ............................................. H04b 1/16

[58] Field of Search .................... 325/452, 464, 465; 74/10, 10.29; 338/68, 118, 128, 131, 160; 334/11, 14, 15, 88

[56] References Cited

UNITED STATES PATENTS

| | | | |
|---|---|---|---|
| 3,522,542 | 8/1970 | Labude et al. | 338/131 |
| 3,551,820 | 12/1970 | Bagwell | 325/465 |
| 3,601,703 | 8/1971 | Midgleg | 325/464 |

*Primary Examiner*—Benedict V. Safourek
*Attorney*—Craig, Antonelli & Hill

[57] ABSTRACT

A tuning device is disclosed for use in radio-frequency communication equipment, in particular television sets. Such a device includes a plurality of tuning units each comprising a push button contact for activating an associated tuning unit and a potentiometer, operatively connected to said push button, to permit selective tuning. Fine tuning is achieved in each tuning unit by an eccentric attached to a tuning spindle to operatively connect the potentiometer.

23 Claims, 6 Drawing Figures

INVENTORS
RUDOLF MAYER,
HANS SAKAUTZKI, LOTHAR VOLKHEIMER
BY Craig, Antonelli & Hill
ATTORNEYS

INVENTORS

RUDOLF MAYER,

HANS SAKAUTZKI, LOTHAR VOLKHEIMER

BY Craig, Antonelli & Hill

ATTORNEYS

INVENTORS

RUDOLF MAYER,

HANS SAKAUTZKI, LOTHAR VOLKHEIMER

BY Craig, Antonelli + Hill

ATTORNEYS

INVENTORS

RUDOLF MAYER,

HANS SAKAUTZKI, LOTHAR VOLKHEIMER

BY Craig, Antonelli & Hill

ATTORNEYS

TUNING DEVICE FOR RADIO-FREQUENCY COMMUNICATIONS EQUIPMENT

The present invention relates to a tuning device for radio-frequency communications equipment, in particular television sets with tuning units, comprising a tuning spindle mounted in a housing for setting a potentiometer having a resistance path concentric with the tuning spindle and a push-button for the tuning spindle to connect the potentiometer in a tuning circuit respectively, the tuning spindles of said tuning units being positioned parallel to each other.

Normally, the potentiomenters of such tuning devices have striate resistance paths which are parallel to the tuning spindles and the tuning spindles are designed as threaded spindles on which non-rotable wipers are mounted so that the wipers can be moved along the resistance path by turning the tuning spindle. The push-buttons are normally designed as slide switches which are arranged parallel to the tuning spindles. The use of such rectilinear potentiometers offers the advantage that the thread of the tuning spindle permits a high reduction ratio of the wiper movement and thus very fine adjustments of the wiper, however, on the other hand, this has the disadvantage that the angular position of the tuning spindle alone does not give any indication of the position of the potentiometer wiper and that relatively complicated scale drives are required to indicate the selected tuning setting as a function of the wiper position. The practices of locating the spindles carrying the potentiometer wipers parallel to the front panel of the tuning device and of using the wipers directly as tuning indicators are certainly known; however, angular drives between the tuning spindles proper and the potentiometer spindles are then required, thereby considerably increasing the price of such a construction; similarly, considerable space is required for the potentiometers which are located in parallel to the front panel of the tuning device. Potentiometers of this type also require considerable space when arranged at right angles to the front panel of the tuning device, resulting in a large constructional depth, which makes such tuning devices unsuitable for many applications.

The use in such tuning devices of conventional potentiometers having resistance paths concentrically arranged to the tuning spindles is also known. In potentiometers of this type the wiper is mounted to the tuning spindle so that the angular position of the tuning spindle directly indicates the selected tuning setting. Relatively simple scale arrangements can therefore be employed. In addition, potentiometers of this type having concentrical resistance paths around the tuning spindle require a minimum of space, both when arranged parallel and at right angles to the front panel of the tuning device, with the result that considerable space is saved in the construction of the tuning devices. However, the disadvantage of the known constructions is that, due to the direct connection between tuning spindle and wiper, precise setting of the wiper is extremely difficult, so that inexperienced users of sets equipped with such tuning devices, in particular, will experience considerable difficulty in carrying out the fine tuning necessary for good reception. This is why tuning devices of this type have hitherto not been used in practice, as for example in television sets.

It is the object of the present invention to avoid the above mentioned disadvantages of the known tuning devices and, in particular, to provide a tuning device with a potentiometer having a concentric resistance path around the tuning spindle, said potentiometer permitting very fine tuning without sacrificing the compactness and simplicity of the tuning indication of such a tuning device.

In the present invention, this problem is solved by providing each tuning spindle with an eccentric carrying a stepped planetary gear the one gear rim of which engages at one point on its circumference in a stationary gear rim which is located in the housing and installed concentrically with the tuning spindle, and the other gear rim of which is connected as part of the drive to the internal toothing of a ring which is concentrically positioned to the tuning spindle in the housing and carries the potentiometer wiper.

Consequently, in the tuning device according to the present invention a planetary gear is positioned between the tuning spindle and a ring carrying the potentiometer wiper and is of a very simple and at the same time compact construction and offers the special advantage of permitting retention of the concentric arrangement of tuning spindle and resistance path. In addition, the ring which is concentric with the tuning spindle and carries the potentiometer wiper may also serve as an indicating element for a scale since its position is identical to the wiper position and therefore characteristic of the selected tuning. In a preferred embodiment of the invention the ring carrying the potentiometer wiper is formed by the flange of a sleeve which is concentric with the tuning spindle, the forward end of said sleeve, bearing a mark and facing away from the ring, extending as far as the plane of an associated scale, at least when the potentiometer is switched on.

The tuning device according to the present invention further permits a design incorporating the tuning spindles as hollow shafts so that the setting shaft of a rotary switch for band and/or standard selection may extend through each of said hollow shafts. The use of such a rotary switch with a switching plane in parallel to the resistance path of the potentiometer is also very simple and only has a negligeable additional space requirement. Nevertheless, such a switch is easy to operate and moreover very reliable. Thus, for example, it is sufficient to provide the forward ends of the setting shaft, facing the actuating side of the tuning device, with diagonal slots so that the setting shafts can be turned by means of a screw drive, and furthermore, said forward ends of the setting shafts may basically lie in the same plane as the forward ends of the sleeves so that they are basically located in the plane of a scale which then may be provided with markings for the bands or standards to which the tuning device is set according to the switch position. The diagonal slot itself may serve as a marking on the setting shaft; however, additional markings may be provided on the front faces of the setting shafts. In a further embodiment of the invention, the tuning device, hitherto only constructed of elements arranged concentrically with respect to one another, also permits the design of the push-buttons which, in a known manner, slide parallel to the tuning spindles in the housing, as basically cylindrical hollow bodies concentrically surrounding the tuning spindles at a distance, said hollow bodies each having a hinged cover closing their outer end. The closed cover is pressed for actuation of the push-button and at the same time protects the tuning spindle of the potentiometer and, if necessary, the setting shaft of a rotary switch against unintentional misadjustment; however, these elements are accessible for actuation after tuning up the cover. In this connection, each push-button may have below its cover a face which extends vertically to the push-button's axis and which serves as scale carrier, said face basically lying in the same plane as the forward end of the sleeve and possibly in the same plane as the setting shaft of a rotary switch, when the push-button is in the operative position, said face circularly surrounding the end of the sleeve. It is evident that in this way the tuning device according to the present invention consists of small, compact units in which a potentiometer, a rotary switch and a push-button are each arranged concentrically with respect to each other so that any number of these units may be combined in any arrangement with respect to each other. In this connection, these units may have separate housings but also fit into a common housing. In particular, due to their compact configuration and concentric construction, these units not only permit series arrangement, as hitherto commonly practiced, but also arrangement in the form of rectangular, preferably square banks of push-buttons which consequently comprise such tuning units arranged in several rows and lines in matrix form. The "operative position of the push-button" is meant to be that position in which the push-button for switching on the associated tuning unit is engaged in the depressd position, whereas, in the following, the other position will be called "rest position."

It is expedient, on the one hand, in order not to hinder the movement of the push-button and, on the other hand, to ensure easy operation of the tuning spindle, to design the tuning spindle as two telescoping parts which are joined to prevent independent rotation and are mutually sprung in the axial plane, one of said parts being fixed in the housing and carrying the eccentric, whilst the forward end of the second part touches the inner sides of the cover or, with the cover opened, projects from the push-button as adjusting knob, in particular, when the push-button is in the operative position. Here again, the second part of the tuning spindle may surround the first part and near its center section it may be provided with an outwardly pointing shoulder with which said second part, in its foremost position, bears against an inwardly projecting collar which is disposed at the forward end of the sleeve. This measure also contributes to the simple construction of the tuning device according to the present invention, because in this case the sleeve connected with the ring carrying the potentiometer wiper not only serves as the indicating element for the scale but also as stop for the spring-loaded part of the tuning spindle.

In a preferred embodiment of the invention, the housing of the tuning device consists of two halves meeting in a plane at right angle to the tuning spindles, the forward housing half essentially supporting the push-buttons and the rear housing half essentially supporting the potentiometers and switches. This housing design permits particularly simple manufacture and assembly, because not only the housing halves can be manufactured easily but also the installation can be carried out in subassemblies comprising the forward housing half on the one hand and the rear housing half on the other, said halves being joined together later on.

In this embodiment of the invention, it may be expedient to provide the rear housing half with a partition with stepped bores each of which being associated with a different tuning device. The tuning spindle part bearing the eccentric, the planetary gear supported on the eccentric and the ring engaged with the planetary gear are then arranged in a center section of the stepped bore, which, over a part of its length, is provided with a stationary gear rim. A section of the tuning spindle extending over the eccentric is mounting in a rear section of the stepped bore of reduced diameter. In addition, said ring is provided with a collar which engages in a forward section of the stepped bore of larger diameter. On its forward face the ring carries the potentiometer wiper which is located in said forward section of the stepped bore. In addition, the stepped bore is closed off at its forward end by an insulating plate which carries the resistance paths of the potentiometers on its inner side and is intersected by the sleeves which are connected with the rings, said sleeves bearing with one shoulder against the inner side of the insulating plate.

The particular advantage of this embodiment of the invention consists in that a correct axial and radial support of the potentiometer drive is achieved since the tuning spindle engages into the section of the stepped bore having the smallest diameter with little play, while the ring is perfectly guided in the center section. In addition, on the one hand, the tuning spindle bears with its eccentric against a forward face of the stepped bore and, on the other hand, the sleeve bears with one shoulder against the inner side of the insulating plate whereby fixation in the axial direction is achieved. Nevertheless, the arrangement can be assembled by simply telescoping and the potentiometer itself is also enclosed and arranged such that it is protected.

For establishing an electrical connection to the potentiometer wiper arranged in the stepped bore and convex surface of the forward section of each stepped bore may be simply coated with a conductive layer, preferably in the form of a metal ring to which a contact lug extending through the insulating plate is connected: The potentiometer wiper then bears against this conductive layer with a sliding contact.

In the construction of the rotary switch a circuit board may be mounted in the rear housing half at a distance behind the partition; the setting shafts, which are guided in the tuning spindle, are supported in said circuit board such that they cannot be displaced, said circuit circuit board being provided with switching contacts on the reverse side in the area of each setting shaft and conducting paths connecting said switching contacts, whilst the rear end of the setting shaft, projecting from the circuit board, is provided with a contact arm which can be selectively brought into engagement with the switching contacts and is further provided with a stop spring engaging with projections in bores in the circuit board. A particularly simple arrangement is achieved if the contact arm and the stop spring are formed by the opposite arms of a preferably and essentially rhombic leaf spring which, in its center section, is secured to the setting shaft.

The forward housing half is expediently provided with a front panel having bores which are associated to the tuning units; and at least on two opposite sides of the bores webs are provided on the forward side of the front panel between which the push-buttons are arranged and which have slots extending vertically to the front panel, resilient detent tabs which are located at the lateral walls of the push-buttons engaging into said slots. The webs ensure perfect guidance of the push-buttons, while the detent tabs engaging in the slots permits easy mounting of the push-buttons as well as limiting the travel of the push-buttons. This again ensures a particularly simple design of the tuning device according to the present invention.

The push-buttons expediently consist of an outer tube portion, which is guided between the webs, and an inner tube portion which is concentric with the outer tube portion; the forward end of said inner tube portion is connected with said outer tube portion by means of a partition which is approximately positioned in the middle of the outer tube portion and the rear end of said inner tube portion extends through the corresponding bore in the front panel. Thus, the outer tube portion mainly serves for guiding and actuating the push-button, whilst the inner tube portion performs switching functions in the interior of the tuning device housing. In this respect, the front of the partition, which connects the two tube portions, at the same time may form the face which carries the scale. In this construction, the cover is supported in the outer tube portion end which is located in front of the partition.

To ensure that the push-button is held in its rest position or returns into the rest position after releasing it, the inner tube portion may be surrounded by a helical tension spring which, at its one end, bears against the partition and, at its other end, against the front panel of the housing. In addition, at the outer side of the inner tube portion a detent tab may be disposed which cooperates with a springloaded lock slide supported on the inner side of the front panel, such that it can be displaced, said lock slide holding the push-button in its operative position and, upon depressing of another push-button, being sufficiently displaced to release a push-button which has been depressed previously.

In a further embodiment of the invention, the rear end of the inner tube portion may be provided with longitudinal slots in which protrusions engage, said protrusions radially inwardly projecting from the circumference of the associated bore in the front panel and the inner end of said protrusions bearing against the circumference of the sleeve which is connected with the ring carrying the potentiometer wiper. In this way, the push-button is additionally secured against turning and its guidance is improved; at the same time additional support is provided near the forward end of the sleeve by means of which said sleeve is perfectly aligned. At the same time said sleeve can therefore be used as support tube for the tuning spindle, i.e., in particular for the second, forward part thereof.

The construction of the push-button from two interconnected tube portions further permits the inner tube portion to be of a circular cross section which, among others, is especially advantageous for supporting the sleeve; on the other hand, the outer tube portion may be of any desired cross section, as is most suitable for the construction of the tuning device. A square cross section of the outer tube portion would probably be most suitable for a matrix-type arrangement of the push-buttons.

The switches required for switching on the selected tuning unit may also have a very simple design. Accordingly, in a preferred embodiment of the invention provision is made that, in the operative position of the push-button, the rear end of the inner tube portion engages with a leaf spring which is secured to the front of the insulating plate and that said leaf spring bears against the contact lug of the associated potentiometer which extends through the insulating plate. In this very simple manner, an electrical connection is established only to the wiper of that tuning unit the push-button of which has been brought into the operative position, so that the voltage picked up by this wiper can be used for tuning purposes, in particular, for the control of capacitance diodes.

If the tuning unit is provided with a band and/or standard selector switch, said band selector switch can be switched on in a similar manner as the associated potentiometer, i.e., by means of a switching plunger attached to each push-button, said plunger, in the operative position of the push-button, engaging with a contact spring which is arranged at the front of the circuit board, said contact spring extending through a cut-out in the circuit board with its free end and said switching plunger pushing said contact spring against a contact bow which is located below the cutout and connected with the contact arm.

Further details the embodiments of the invention will become apparent from the following specification in which the invention is described and explained in detail, reference being made to the embodiments shown by way of example in the accompanying drawing.

In other embodiments of the invention, the features apparent from the specification and the drawing may be applied either individually or in any combination of a plurality of such features. In the accompanying drawing FIG. 1 is a plan view of a tuning device according to the present invention, showing nine push-buttons arranged in the form of a square matrix one of which is represented with the cover opened;

Figure 1:
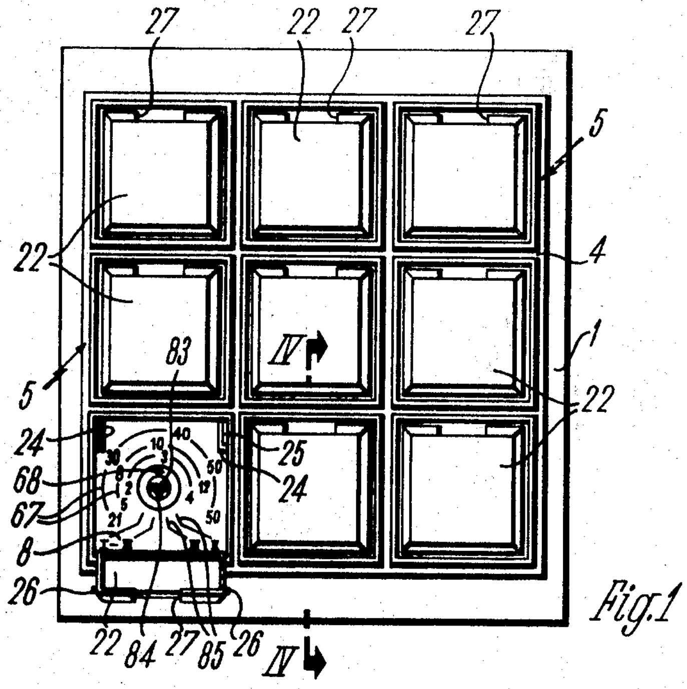
Figure 6:
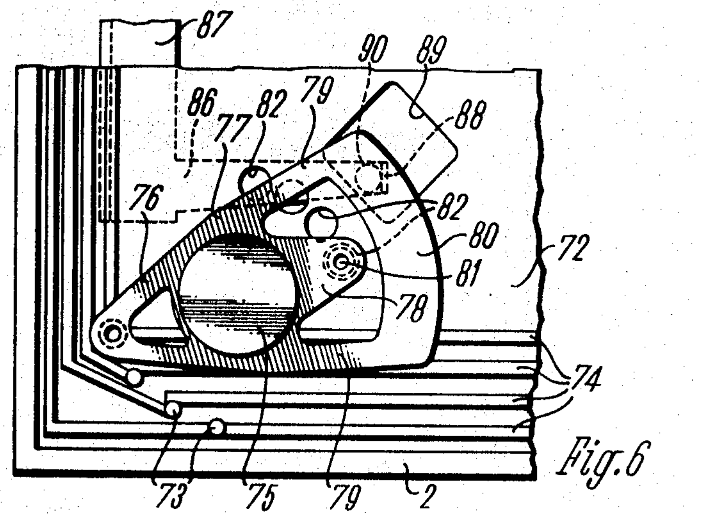
FIG. 6 is a view of a rotary switch of the tuning device according to FIG. 1 in the direction indicated by the arrow VI in FIG. 2.

As can be seen from FIG. 1, the tuning device shown in the accompanying drawing comprises nine tuning units which, as can also be seen from FIG. 1, are arranged in the form of a square push-button panel. The tuning units provided in the tuning device according to the present invention are independent of each other regarding their construction and may be arranged in appropriately designed housings in any desired number and in any desired combination. It would also be possible to design the individual tuning units with separate housings and to combine them optionally to tuning devices comprising a plurality of tuning units.

Figure 2:
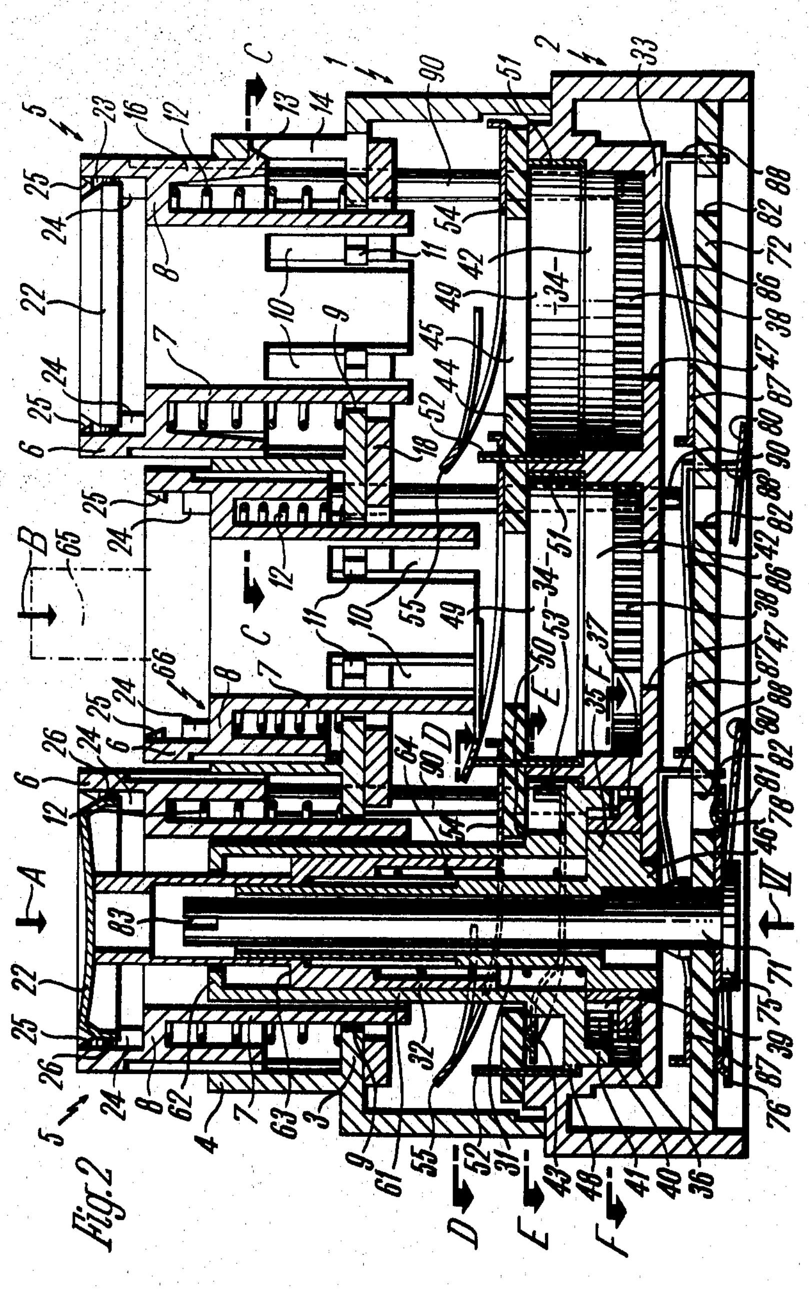
FIG. 2 is a section through the series-arranged tuning units of the tuning device according to FIG. 1, taken along the line II—II in FIG. 3, in which details are omitted for pusposes of clarity.
Figure 4:
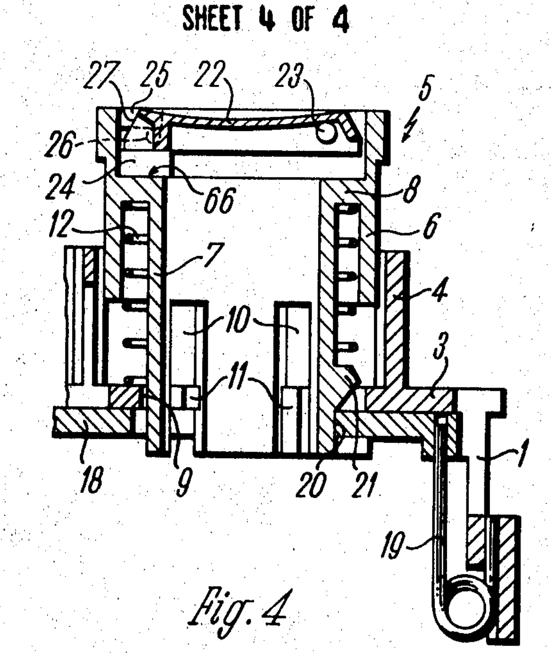
FIG. 4 is a section, taken along the line IV—IV, through the forward housing half and the tuning knob of the tuning device according to FIG. 1 on the scale of FIG. 2.
Figure 5:
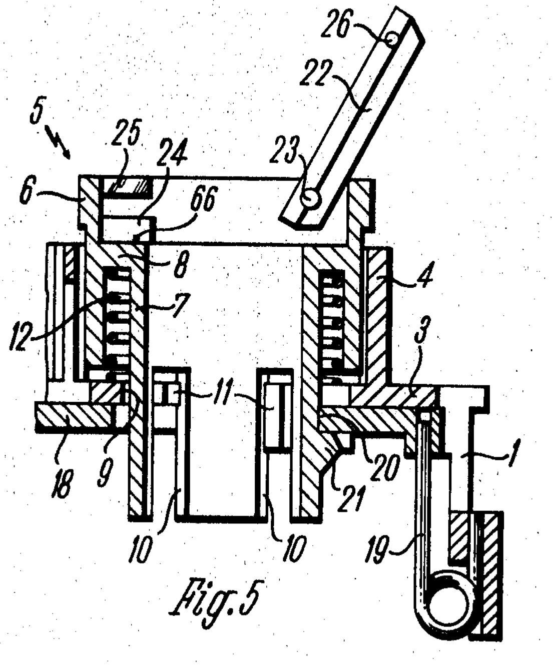
FIG. 5 is a section similar to that of FIG. 4, however, with the push-button in the operative position and the cover opened.

In the embodiment of the tuning device according to the present invention shown by way of example, each tuning unit comprises a potentiometer, a rotary switch for band and/or standard selection and a push-button switch for switching on and off the potentiometer and the rotary switch. The individual elements of these tuning units are accommodated in a common housing consisting of two halves, namely of a forward housing half 1 and a rear housing half 2. The forward housing half 1 constitutes a box which is open at the rear and has a front panel 3 at the face of which are webs 4 forming a square screen. Accordingly, these webs 4 constitute shaft-type guides in which the push-buttons 5, associated to the individual tuning units, are guided. Each of these push-puttons consists of an outer tube portion 6 of a square cross section, which is guided between the webs 4, said tube portion being arranged concentrically with respect to an inner tube portion 7 and connected near its center section to the forward end of the inner tube portion 7 by means of a partition 8. While the outer portion 6 is always positioned at the face of the front panel 3 of the forward housing half 1, the inner tube portion 7, having a circular cross section, extends through a corresponding bore 9 in the front panel 3. The rear end of the inner tube portion 7 which extends through the front panel 3 of the forward housing half 1 is provided with longitudinal slots 10 in which protrusions engage which radially, inwardly project from the circumference of the associated bore 9. As will be explained later, the ends of said protrusions guide a sleeve. In the area between the outer surface of front panel 3 and partition 8 the inner tube portion 7 is surrounded by a helical tension spring 12 which rest between the outer surface of the front panel 3 and the inner surface of partition 8 and which is intended to retain push-button 5 in a rest position in which partition 8 is in the greatest possible distance from the front panel 3, i.e., when the push-button projects farthest from the housing and, in particular, from the webs 4 thereof. FIG. 2 shows the two outer push-buttons in this rest position. As can be seen from FIG. 2 on the right, the push-button is retained in this rest position by means of detents 13 which engage in slots 14 of webs 4, said slots extending vertically to the front panel 3. The detents 13 are mounted to the rear ends of resilient tongues 16 which are separated from the lateral walls of the square, outer tube portion 6 of push-button 5 by means of corresponding longitudinal slots 17. Retaining of the push-buttons 5 in the operative position shown in the middle of FIG. 2 as well as in FIG. 5 is ensured by a lock slide 18 which, in a manner not shown in detail, is slidably disposed on the inner surface of the front panel 3 of the forward housing half 1 and which, as can be seen from FIGS. 4 and 5, is spring-loaded by an operating lever spring 19 such that is bears with one edge 20 against a point of the section of the push-button's inner tube portion 7, which extends through the bore 9 in the front panel 3. At said point a detent tab 21 is provided on the outside of the inner tube portion 7, said lock slide 18 overlapping said detent tab 21 when the push-button is depressed, i.e., when it is in the operative position, as can be seen from FIG. 5. The detent tab 21 is designed in a known manner such that upon depressing of another push-button the lock slide 18 is sufficiently displaced to release a push-button which has previously been brought into the operative position, with the result that, at any time, only that push-button is in this operative position which has been brought into said operative position last. Actuation of the push-button is facilitated by means of a cover 22, which is hinged at pivot 23 in the section of the outer tube portion 6 projecting beyond the inner tube portion 7 in the forward direction and which, in the area of its forward edge, in the closed position bears against stops 24 which are disposed on the inside of the outer tube portion 6. Above said stops 24 detent tabs 25 are located under which, in the closed position, the cover 22 engages by means of pins 26 located on the outer surfaces of said cover (see, in particular, FIGS. 4 and 5). The edge of cover 22 facing away from hinge pivot 23 is provided with a cut-out 27 which facilitates opening of the cover.

The tuning spindle of a potentiometer, consisting of two telescoping portions 31 and 32 which are connected to each other by means of a slot guide to prevent independent turning, is concentric with each push-button 5. The rear portion 31 of the tuning spindle is supported in the rear housing half 2 which is provided with a partition 33 extending in parallel to the front panel 3 of the forward housing half 1, said partition having stepped bores 34. Each of said stepped bores 34 is associated with a tuning unit and positioned concentric with the bore 9 in the front panel 3 of the forward housing half 1. The forward housing half 1 rests with its rear edge on a edge at the front of the rear housing half 2 in a vertical plane with respect to tuning spindles 31, 32. Whereas the forward housing half 1 is basically used for supporting the push-buttons 5, the rear housing half 2 is basically used for supporting the potentiomenters and switches which are associated with the individual tuning units.

The rear portion 31 of the tuning spindle, accommodated in the rear housing half 2, has an eccentric 35 on which a stepped planetary gear 36 is rotatably supported. Said planetary gear 36, by means of its gear rim 37 having a larger diameter, at one point of its circumference engages with a gear rim 38 which is concentric with the tuning spindle 31, 32, said gear rim being located in the center section of the stepped bore 34 of the rear housing half 2 and extending over a part of the length of said center section. A second gear rim 39 of the same planetary gear, having a smaller diameter, is in mesh with the internal toothing 40 of ring 41 which is rotatably supported on the same center section 42 of the stepped bore 34 and carries a potentiometer wiper 43 on its forward face. The potentiometer wiper bears against the corresponding resistance paths provided on the inner surfaces of an insulating plate 44 which bounds the stepped bores at its forward end and which is mounted on the front of the partition 33 of the rear housing half 2. Said insulating plate 44 comprises bores 45 which are concentric with the stepped bores 34, the tuning spindles 31, 32 and further elements still to be described extending through said bores 45.

The rear portion 31 of the tuning spindle is supported with section 46, projecting over the eccentric 35, in a rear portion 47 of the stepped bore 34 which has a smaller diameter, so that the eccentric 35 at the same time constitutes a stop for retaining the tuning spindle in the axial direction. In addition, the ring 41 carrying the potentiometer wiper 43 is provided with a collar 48 by means of which said ring engages in a forward section 49 of the stepped bore having a larger diameter. In this way, also the axial position of said ring, against the rear side of which the eccentric 35 bears, is fixed, whereby the rear portion 31 of the tuning spindle is secured also in the axial direction. Aditionally, the planetary gear 36 is securely retained in the center section 42 of the stepped bore between the rear wall of said center section and the ring. The ring 41, in turn, is secured in the stepped bore 34 by bearing against the inside of insulating plate 44 with a shoulder 50.

For establishing an electrical connection to the wiper 43 which is provided in the forward section 49 of stepped bore 34, the convex surface of said forward section is covered with an electrically conductive layer in the form of a metal ring 51 with which a contact lug 52, extending through the insulating plate 44, is connected and against which the potentiometer wiper 43 bears with a bent sliding contact 53. On the front side of the insulating plate 44 leaf springs 54 are arranged at a distance opposite the individual contact lugs 52 and connected by a strap 55. If one push-button is in the operative position, as is the case with the push-button in the middle of FIG. 2, the rear end of the inner tube portion 7 of this push-button comes to rest on the leaf spring 54 and thereby presses said leaf spring 54 against the contact lug 52. Consequently, the leaf spring 54, together with the contact lug 52, constitutes a switch which can be actuated via push-button 5 for switching on any one of the provided potentiometers.

For the indication of the respective potentiometer position a sleeve 61, which is connected with the ring 41 carrying the potentiometer wiper 43, is used, said sleeve surrounding the parts 31 and 32 of the tuning spindle at a distance, extending also through the front panel 3 of the forward housing half 1 and approximately extending as far as the plane of the upper edge of webs 4 which are provided on the front side of front panel 3. The radially inwardly extending protrusions 11 in the bores 9 of the front panel 3 contact the circumferential surface of sleeve 61 and provide guide means for said sleeve. In addition, at its forward end, sleeve 61 has an inwardly extending collar 62 which provides a stop for the forward part 32 of the tuning spindle. Said forward part 32 of the tuning spindle surrounds the rear part 31 and has an outwardly pointing shoulder 63 in its center section which, in the most forward position, bears against the collar 62 at the forward end of sleeve 61. A helical tension spring 64, arranged on the rear part 31 of the tuning spindle tends to press the forward part 32 with its shoulder 63 against the collar 62 of sleeve 61. Normally, however, with its forward end the forward part 32 of the tuning spindle rests against the inside of the closed cover 22 of the associated push-button. However, when cover 22 is opened, the spring 64 pushes the forward part 32 of the tuning spindle up to the stop at collar 62 of sleeve 61; i.e., beyond the plane of the push-button, so that the forward end of the tuning spindle is perfectly accessible and is used as tuning knob when the push-button is depressed, as is indicated by the dash-dotted contour 65.

Figure 3:
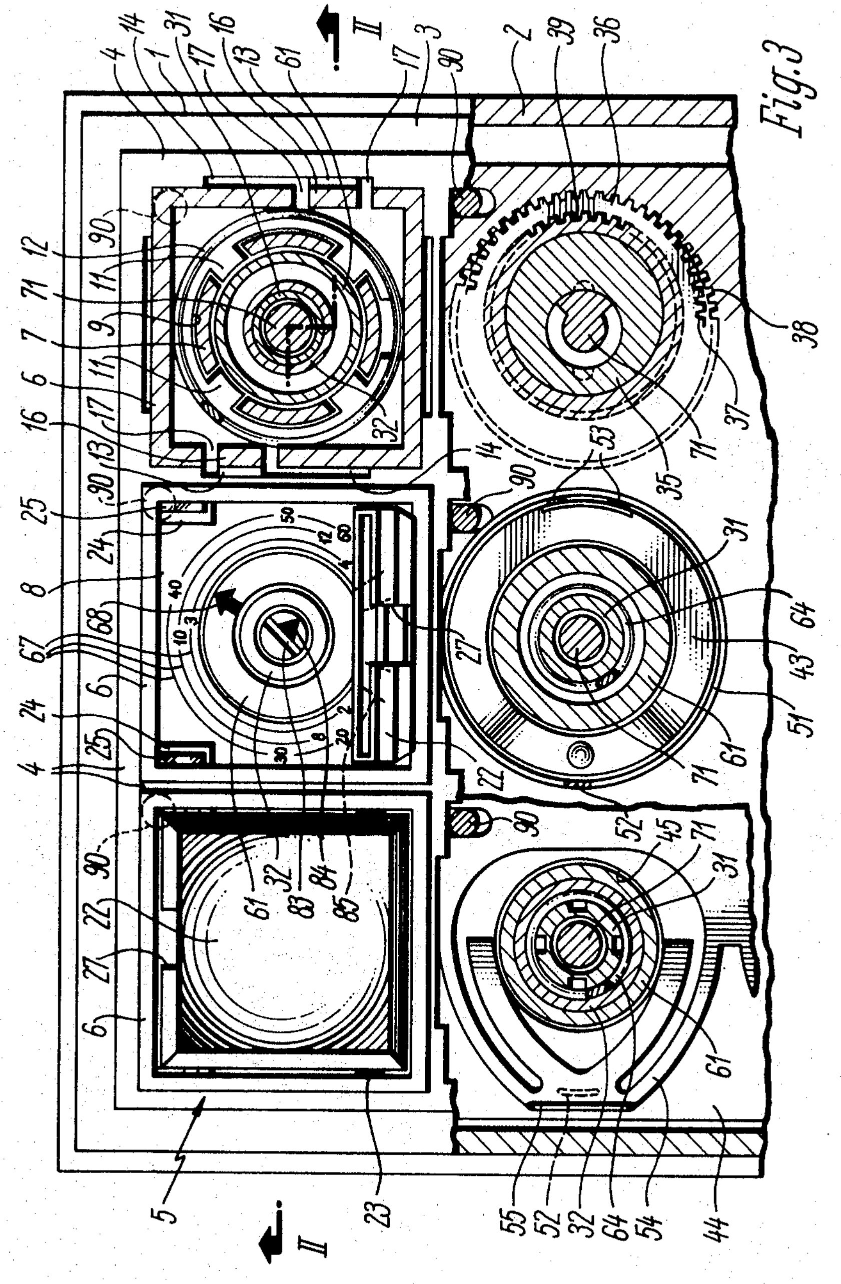
FIG. 3 is an illustration of the two upper rows of the tuning device according to FIG. 1 on the scale of FIG. 2, partially as a plan view in the direction indicated by the arrows A and B and partially as a section taken along the lines C—C, D—D, E—E and F—F in FIG. 2.

As can be further seen from FIG. 2, the forward face 66 of partition 8 also lies in the same plane as the forward faces of webs 4 when the push-button 5 is in the operative position. Consequently, with the push-button depressed, the front of partition 8 and the forward end of sleeve 61 lie in the same plane. For this reason, a scale can be located on the forward face 66 of partition 8 and a pointer on the forward face of sleeve 61, the relative position of said pointer with respect to the scale indicating the respectively selected tuning. Normally, however, said scale is hidden under cover 22 but, generally, reading of the scale is only required if the pre-set tuning is to be changed; for changing the tuning by means of the tuning spindles 31, 32, in any case the cover 22 must be opened, said cover, as has already been described, being supported on that end of the outer tube portion 6 of push-button 5 which is located in front of partition 8. FIGS. 1 and 3 are plan views of partition 8 with scale 67 and the arrow 68 on the end of sleeve 61 which serves as mark.

As has already been mentioned, the tuning units of the embodiment of the tuning device shown by way of example are each provided with one rotary switch for band and/or standard selection. For this purpose the tuning spindles 31, 32 are designed as hollow shafts and are each penetrated by the setting shaft 71 of said rotary switch. Said setting shafts 71 are rotatably supported in a circuit board 72 such that they cannot be displaced, said circuit board 72 being mounted in the rear housing half 2 at a distance behind partition 33 thereof. On the rear side said circuit board 72 has switching contacts 73 in the vicinity of each setting shaft 71; the corresponding contacts are connected to one another by means of conductive paths 74 leading to terminal points which are not shown here. The end 75 of setting shaft 71, projecting from the circuit board 72, is provided with a contact arm 76. Said contact arm is part of a leaf spring 77 having an arm 78 opposite said contact arm 76 which constitutes a stop spring and said leaf spring further having a contact bow 80 which is supported by legs 79 extending beyond the stop spring 78. The stop spring 78 is provided with a projection 81 which enables said stop spring to engage in appropriate bores 82 in the circuit board 72, said bores serving as stops. A diagonal slot 83 at the forward end of the setting shaft 71 permits turning of the rotary switch by means of a screw-driver. When the push-button has been brought into its operative position, the forward end of the setting shaft 71 slightly projects beyond the plane in which the scale carrying face 66 of the partition of the push-button is located, so that said diagonal slot or a mark 84 on the forward end of the setting shaft is perfectly visible through the hollow tuning spindle 31, 32, when the cover is opened. On the forward face of partition 8 of push-button 5, again, markings 85 are provided, said mark 84 on the forward end of setting shaft 71 being located opposite said markings 85 and thus permitting indication of the selected band and/or standard.

In a manner similar to that employed for tapping from the potentiometer a tuning voltage which is picked up from the associated potentiometer only if the push-button is depressed, the rotary switch is also used for tapping a switching voltage which is picked up by the corresponding rotary switch only if the associated push-button is in the operative position. For this purpose contact springs 86 are arranged on the front of the circuit board 72, said springs 86, in turn, being connected with each other by means of a strap 87 and, in their rest position, bearing against the rear of partition 33 of the rear housing half 2. On their free ends said contact springs 86 have bent portions 88 which engage in corresponding cut-outs 89 in the circuit board 72 and are spaced at a distance opposite each contact bow 80 of the leaf spring of the associated rotary switch. In addition, in the corner of the outer tube portion 6 of each push-button 5 a switching plunger 90 is provided which extends through corresponding cut-outs in the housing halves 1 and 2 as well as in the insulating plate 44 and which faces the free end of a contact spring 86 at a distance, when the push-button is in its rest position. However, if the push-button is depressed into the operative position, as shown in the middle of FIG. 2, the rear end of the switching plunger 90 pushes the contact spring 86 towards the circuit board 72 and thereby presses the bent end 88 of said contact spring 86 against the contact bow 80 of the rotary switch. Thus, voltage is only picked up by that rotary switch whose associated push-button is in the operative position; the voltage is supplied to an appropriate circuit arrangement in a manner not explained herein.

It is evident from the above mentioned that the embodiment of the tuning device shown by way of example comprises nine, substantially independent tuning units each of which include a potentiometer for generating a tuning voltage and a rotary switch for generating a switching voltage as well as a push-button which permits connection of the potentiometer and the rotary switch in circuit arrangements not shown in detail herein, whereby tuning is effected. The individual tuning units are extremely small since they require neither a large constructional depth nor a large diameter. Moreover, they are suited for any desired arrangement, in particular in the form of a series arrangement or of matrix-type panels. Owing to the possibility of matrix-type arrangement in panels, a hitherto unknown compactness can be achieved. The use of a planetary gear in connection with a rotary potentiometer ensures very fine tuning combined with a minimum space requirement. Nevertheless, the construction of the tuning device according to the present invention remains very simple.

From the above mentioned it already appears that the invention is not limited to the embodiment shown by way of example, but that variations thereof are possible without exceeding the scope of the present invention. In particular, the tuning device is not restricted to a square arrangement with 3 × 3 push-buttons, but the push-buttons may be arranged in any optional configuration. Moreover, instead of square push-buttons also round, rectangular, hexagonal or other designs of push-buttons may be employed. In the same way, it is not absolutely necessary for the tuning devices to have rotary switches but individual push-buttons may be permanently assigned to specific frequency ranges. With respect to the design of the contacts operated by push-buttons, for example, further variations of the embodiment shown may result in the design of the contact springs for the switches and/or of the potentiometers. However, the embodiment shown by way of example, actually constitutes as a whole a particularly advantageous embodiment of the present invention.

Having thus fully described our invention, what we claim as new and wich to secure by Letters Patent is:

1. A tuning device for radio-frequency communications equipment, in particular for television sets, having a housing with a plurality of tuning units therein, each tuning unit comprising a potentiometer; a tuning spindle supported in said housing for setting said potentiometer, the tuning spindles of each tuning unit being in parallel with each other; and said housing having a resistance path concentric with each said tuning spindle; a push button switch associated with said tuning spindle for connecting said potentiometer in a tuned circuit; an eccentric operatively connected to a rear portion of said spindle, a stepped planetary gear supported by said eccentric; a stationary gear rim, supported by said housing concentrically about said planetary gear, and engaging with at least one first gear rim at a position on the circumference of said planetary gear; a second rim of said planetary gear having a smaller diameter from said first gear rim and located adjacent to said first gear rim; a ring rotatably supported in said housing concentrically about said tuning spindle, and having gear teeth disposed on an internal surface therein, said internally disposed gear teeth operatively engaging with said second gear rim; and a potentiometer wiper carried by said rotatable ring.

2. A tuning device according to claim 1, further comprising a rotatable sleeve concentrically disposed about said tuning spindle having an index mark on a flange at the forward end thereof, and forming said ring by a flange at rear end thereof; and a scale disposed at an inner face of said push button switch, so as to indicate by said mark a selected tuning position when said tuning unit is activated by said push button switch.

3. A tuning device according to claim 1, wherein said tuning spindle is a hollow shaft, and a setting shaft of a rotary switch is disposed therein for band and/or standard selection.

4. A tuning device according to claim 3, wherein the forward end of said setting shaft is provided with a diagonal slot.

5. A tuning device according to claim 1, wherein said push button switch is formed of a hollow body, supported by said housing so as to be moved concentrically about and parallel to said tuning spindle, said hollow body having a cover operatively opening and closing the outer end thereof.

6. A tuning device according to claim 5, further comprising a rotatable sleeve concentrically disposed about said tuning spindle having an index mark on a flange at the forward end thereof; and a scale disposed at an inner face of said push button switch, so as to indicate by said mark a selected tuning position when said tuning unit is activated by said push button switch; and wherein said inner face of said push button switch is disposed under said cover and is positioned in the same plane as the forward end of said sleeve, concentrically thereabout, when said push button switch is in an operative position.

7. A tuning device according to claim 5, wherein said tuning spindle is formed of a first and second telescoping portion connected to prevent independent rotation and mutually sprung in the axial direction, said first portion operatively connected to said eccentric, and said second portion having a forward end, disposed against said closed cover when said push button switch is in an inoperative position, and projecting from said open cover when said push button switch is in an operative position.

8. A tuning device according to claim 7, further comprising a rotatable sleeve concentrically disposed about said tuning spindle having an index mark on a flange at the forward end thereof, and forming said ring by a flange at the rear end thereof; and a scale disposed at an inner face of said push button switch, so as to indicate by said mark a selected tuning position when said tuning unit is activated by said push button switch; and wherein said second portion of said tuning spindle surrounds a part of said first portion, and has an upwardly disposed shoulder, said shoulder bearing against an inwardly projecting collar disposed at the forward end of said sleeve when said second portion is in its most extended position.

9. A tuning device according to claim 1, wherein said housing is formed of a forward half and a rear half joined in a plane transverse to each said tuning spindle of said tuning units, said forward housing half supporting each said push button switch of said tuning units and said rear housing half supporting each said potentiometer of said tuning units.

10. A tuning device according to claim 9, wherein said rear housing half comprises partitions for forming stepped bores associated with each tuning unit, said stepped bores forming a cylindrical center chamber with each tuning unit, containing therein said eccentric, stepped planetary gear, stationary gear, and ring, said center chamber comprising a rear section having rear face with an aperture through which a reduced diameter portion of said tuning spindle passes, a larger diameter forward section of said chamber having an insulating plate at its forward end, said insulating plate supporting at its rear surface the resistance path of said potentiometer, wherein said potentiometer wiper is disposed in said forward section.

11. A tuning device according to claim 10, wherein the circumference of the forward section is covered with a conductive layer, preferably a metal ring having a contact lug extending through said insulating plate, wherein said potentiometer wiper is connected to said lug by a slide contact.

12. A tuning device according to claim 10, wherein said tuning spindle is a hollow shaft, and a setting shaft is disposed therein, said setting shaft extending through said rear section, being supported at its rear end by a circuit board, and having a rear portion,provided with a contact arm,extending from said circuit board, said circuit board including at its rear surface adjacent to each setting shaft switching contacts connected by conductive paths, said switching contacts and said contact arm being selectively engageable, and a stop spring having projections engaging in bores disposed in said circuit board.

13. A tuning device according to claim 12, wherein said contact arm and said stop spring are formed by the oppositely disposed arms of a preferably basically rhombic leaf spring, supported by said rear portion of said setting shaft.

14. A tuning device according to claim 9, wherein each push button switch is formed of a hollow body, supported by said housing so as to be moved concentrically about and parallel to said tuning spindle, said hollow body having a cover operatively opening and closing the outer end thereof, and wherein said forward housing half is formed of a front panel having openings therein associated with each tuning unit, each opening having webs disposed at the forward side of the front panel on at least two opposite sides of said openings, said push button switches being arranged between said webs and having resilient detent tabs at lateral walls of said push button switch body engaging in vertical slots disposed in said webs.

15. A tuning device according to claim 14, wherein said hollow body of said push button switch comprises an outer tube portion extending between said webs and an inner tube portion concentric with said outer tube portion and connected at its forward end to said outer tube portion by a partition approximately disposed at the center of said outer tube portion, the rear end of said inner tube portion extending through said opening to said front panel.

16. A tuning device according to claim 15, further comprising a rotatable sleeve concentrically disposed about said tuning spindle having an index mark on a flange at the forward end thereof; and a scale disposed at an inner face of said push button switch, so as to indicate by said mark a selected tuning position when said tuning unit is activated by said push button switch; and wherein said inner face of said push button switch is disposed under said cover and is positioned in the same plane as the forward end of said sleeve, concentrically thereabout, when said push button switch is in an operative position; and wherein said partition forms said scale disposed inner face of said push button, and wherein said cover is supported at the front end of said outer tube portion of said push button switch.

17. A tuning device according to claim 15, wherein said inner tube portion of said push button switch is surrounded by a helical tension spring, one end bearing against said partition and the other end bearing against said front panel.

18. A tuning device according to claim 15, wherein said detent tabs are disposed on the outer surface of said inner tube portion, said detent tabs operatively connected to a sping-loaded lock slide, slidably disposed at the inner side of the front panel.

19. A tuning device according to claim 15, further comprising a rotatable sleeve concentrically disposed about said tuning spindle having an index mark on a flange at the forward end thereof, and forming said ring by a flange at rear end thereof; and a scale disposed at an inner face of said push button switch, so as to indicate by said mark a selected tuning position when said tuning unit is activated by said push button switch, wherein radially and inwardly projecting protrusions engage with longitudinal slots formed at the rear end of said inner tube portion, the inner ends of said protrusions bearing against the circumference of said sleeve.

20. A tuning device according to claim 15, wherein the inner tube portions of said push button switches have a circular cross-section and the outer tube portions of said push button switches have a square cross-section.

21. A tuning device according to claim 15, wherein said rear housing half comprises stepped bores forming a cylindrical center chamber with each tuning unit, said center chamber including a rear section having a rear face and a larger diameter forward section having an insulating plate at the forward end thereof, the circumference of the forward section being covered with a conductive layer, preferably a metal ring having a contact lug extending through said insulating plate, and wherein the rear end of said inner tube portion contacts with a leaf spring when the push button is operative, said leaf spring positioned on the front side of said insulating plate and bearing against said contact lug in the operative position.

22. A tunable device according to claim 15, wherein said rear housing half comprises stepped bores forming a cylindrical center chamber with each tuning unit, said center chamber including a rear section having a rear face and a larger diameter forward section having an insulating plate at the forward end thereof; said tuning spindle being a hollow shaft having a setting shaft disposed therein, said setting shaft extending through said rear section, and having a rear portion provided with a contact arm supportably extending through a circuit board, wherein said circuit board has positioned on the front surface thereof a contact spring, bearing against a contact bow and connected to said contact arm, said contact spring being operatively connected to a switching plunger, attached to said push button switch, when said push button switch is operative.

23. A tunable device according to claim 1, wherein said plurality of tuning units is arranged in a rectangular, preferably square, push button panel.

* * * * *